US008772926B2

(12) United States Patent
Otaki et al.

(10) Patent No.: US 8,772,926 B2
(45) Date of Patent: Jul. 8, 2014

(54) PRODUCTION METHOD OF COOLER (71) Applicant: Showa Denko K.K., Tokyo (JP)

(72) Inventors: Atsushi Otaki, Oyama (JP); Shigeru Oyama, Oyama (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/888,460

(22) Filed: May 7, 2013

(65) Prior Publication Data

US 2013/0299963 A1    Nov. 14, 2013

(30) Foreign Application Priority Data

May 8, 2012 (JP) .................................. 2012-106885

(51) Int. Cl.
    *H01L 23/34*     (2006.01)
    *H01L 21/00*     (2006.01)
    *H05K 7/20*     (2006.01)

(52) U.S. Cl.
    USPC .......... 257/712; 438/122; 361/707; 361/709; 361/711

(58) Field of Classification Search
    USPC ............ 257/712–722; 438/122; 361/688–723
    See application file for complete search history.

(56) References Cited

U.S. PATENT DOCUMENTS

| 7,776,452 | B2* | 8/2010 | Shiomi et al. ................. 428/663 |
| 8,299,606 | B2* | 10/2012 | Mori et al. ..................... 257/706 |
| 2001/0040180 | A1* | 11/2001 | Wittebrood et al. .......... 228/219 |
| 2002/0089828 | A1* | 7/2002 | Suzuki et al. ................. 361/709 |
| 2003/0102553 | A1* | 6/2003 | Ishikawa et al. .............. 257/707 |
| 2003/0155409 | A1* | 8/2003 | Dockus et al. ................ 228/245 |
| 2006/0166028 | A1* | 7/2006 | Sagawa et al. ................ 428/619 |
| 2012/0182692 | A1* | 7/2012 | Mori et al. .................... 361/709 |

FOREIGN PATENT DOCUMENTS

| JP | 2004-235503 A | 8/2004 |
| JP | 2004-328012 A | 11/2004 |
| JP | 2006-303346 A | 11/2006 |
| JP | 2009-147123 A | 7/2009 |

* cited by examiner

*Primary Examiner* — Karen Kusumakar
(74) *Attorney, Agent, or Firm* — Keating & Bennett, LLP (57) ABSTRACT The production method of a cooler includes a laminated material production step S1 and a brazing joining step. In the laminated material production step, a laminated material is formed by integrally joining a Ni layer made of Ni or a Ni alloy having an upper surface to which a member to be cooled is to be joined by soldering, a Ti layer made of Ti or a Ti alloy and arranged on a lower surface side of the Ni layer, and an Al layer made of Al or an Al alloy and arranged on a lower surface side of the Ti layer in a laminated manner. In the brazing joining step, a lower surface of the Al layer of the laminated material and a cooling surface of a cooler main body are joined by brazing.

10 Claims, 3 Drawing Sheets

PRODUCTION METHOD OF COOLER

CROSS-REFERENCE TO RELATED APPLICATIONS

The present invention claims priority to Japanese Patent Application No. 2012-106885 filed on May 8, 2012, the entire disclosure of which is incorporated herein by reference in its entirety.

TECHNICAL FIELD

The present invention relates to a production method of a cooler used for a member to be cooled such as an insulating substrate, a production method of a semiconductor module, a cooler, and a semiconductor module.

In this specification, a term "plate" is used to include a meaning of "foil." Furthermore, for the convenience of explanation, a surface side of a cooler to which a member to be cooled is to be joined will be referred to as an upper surface side of the cooler (cooler main body). Furthermore, a term "a plate-like brazing material" means a flattened brazing material including, e.g., a brazing material formed into a plate, sheet, or film shape.

TECHNICAL BACKGROUND

In a semiconductor module such as a power semiconductor module, a semiconductor element is mounted on an insulating substrate. For the purpose of decreasing the increased temperature of the semiconductor element occurred during the operation of the semiconductor element, the insulating substrate is arranged on and joined to a cooling surface of a cooler (including a heat dissipation/radiation device, such as, e.g., a heat sink, a heat dissipation/radiation plate, etc.).

Such an insulating substrate includes a ceramic layer as an electrical insulating layer, a wiring layer (circuit layer), etc. (see, e.g., Japanese Unexamined Laid-open Patent Application Publication (hereinafter simply referred to as "JPA") 2004-328012, JPA 2004-235503, JPA 2006-303346, JPA 2009-147123). The wiring layer is made of, e.g., copper, aluminum, etc.

As a cooler, a cooler made of copper or aluminum (including its alloy) is used. In recent years, a cooler made of aluminum is widely used. The main reason is that an aluminum cooler is light in weight and can be obtained at low cost.

SUMMARY OF THE INVENTION

Problems to be Solved by the Invention

An aluminum cooler, however, is poor in soldering joinability. Therefore, when joining an insulating substrate to a cooling surface of an aluminum cooler by soldering, it is required to form a Ni plated layer on a cooling surface of a cooler to improve the soldering joinability.

In cases where a Ni plated layer is formed on a cooling surface of a cooler, however, contamination of the Ni plated layer due to insufficient washing and/or drying may cause poor solder wettability. Specifically, when forming a Ni plated layer on the entire surface of the cooler, since the cooler is generally complex in shape, there was a drawback that such poor solder wettability easily occurred.

The present invention was made in view of the aforementioned technical background, and aims to provide a production method of a cooler excellent in soldering joinability, a production method of a semiconductor module equipped with such a cooler, a cooler, and a semiconductor module.

The other objects and advantages of the present invention will be apparent from the following preferred embodiments.

Means to Solve the Problems

The present invention provides the following means.

[1] A production method of a cooler, comprising:
a laminated material production step of producing a laminated material formed by integrally joining a Ni layer made of Ni or a Ni alloy having an upper surface to which a member to be cooled is to be joined by soldering, a Ti layer made of Ti or a Ti alloy and arranged on a lower surface side of the Ni layer, and an Al layer made of Al or an Al alloy and arranged on a lower surface side of the Ti layer in a laminated manner; and
a brazing joining step of joining a lower surface of the Al layer of the laminated material and a cooling surface of a cooler main body by brazing.

[2] The production method of a cooler as recited in Item [1], wherein, in the brazing joining step, the joining is performed by brazing using a brazing sheet as a brazing material.

[3] The production method of a cooler as recited in Item [1], wherein, in the brazing joining step, the joining is performed by brazing using a plate-shaped brazing material as a brazing material.

[4] The production method of a cooler as recited in any one of Items [1] to [3], further comprising a Ni oxide film removal step of removing a Ni oxide film formed on the upper surface of the Ni layer of the laminated material after the brazing joining step.

[5] The production method of a cooler as recited in any one of Items [1] to [4], wherein the laminated material production step includes a first diffusion joining step of joining the Ni layer and the Ti layer by diffusion joining to thereby form a Ni—Ti series superelastic alloy layer in which Ni in the Ni layer and Ti in the Ti layer are alloyed at a bonded interface of the Ni layer and the Ti layer.

[6] The production method of a cooler as recited in Item [5], wherein the laminated material production step includes a second diffusion joining step of joining the Ti layer and the Al layer by diffusion joining after the first diffusion joining step.

[7] A production method of a semiconductor module, comprising the step of:
joining an insulating substrate as a member to be cooled to which a semiconductor element is to be mounted to the upper surface of the Ni layer of the laminated material of the cooler obtained by the production method as recited in Items [1] to [6] by soldering.

[8] A cooler obtained by the production method of a cooler as recited in any one of Items [1] to [6].

[9] A semiconductor module obtained by the production method of a semiconductor module as recited in Item [7].

[10] The cooler comprising:
a laminated material formed by integrally joining a Ni layer made of Ni or a Ni alloy having an upper surface to which a member to be cooled is to be joined by soldering, a Ti layer made of Ti or a Ti alloy and arranged on a lower surface side of the Ni layer, and an Al layer made of Al or an Al alloy and arranged on a lower surface side of the Ti layer in a laminated manner,
wherein a lower surface of the Al layer of the laminated material and a cooling surface of a cooler main body are joined by brazing.

[11] A semiconductor module, wherein an insulating substrate as a member to be cooled to which a semiconductor element is to be mounted is joined to an upper surface of the Ni layer of the laminated material of the cooler as recited in Item [10] by soldering.

Effect of the Invention

The present invention exerts the following effects.

According to the production method of a cooler as recited in Item [1], a cooler excellent in soldering joinability can be obtained since, in the soldering joining step, the upper surface of the Ni layer of the laminated material is arranged on the upper surface side of the cooler (i.e., the surface side of the cooler to which a member to be cooled is to be joined) by joining the lower surface of the Al layer of the laminated material and the cooling surface of the cooler main body. Therefore, a member to be cooled, such as an insulating substrate, can be joined well to the upper surface of the Ni layer of the cooler by soldering.

Furthermore, in the laminated material production step, the following effects are exerted since the Ti layer is arranged between the Ni layer and the Al layer. That is, if the Ni layer and the Al layer are directly joined without arranging the Ti layer between the Ni layer and the Al layer, an alloy layer poor in strength will be formed at the bonded interface of the Ni layer and the Al layer. As a result, due to the thermal stress (heat strain) caused by, e.g., cooling/heating cycles, breaking and/or detachments at the alloy layer can easily occur. On the other hand, in the laminated material produced in the laminated material production step, such an alloy layer poor in strength will not be formed since the Ti layer is arranged between the Ni layer and the Al layer. This prevents occurrences of breaking and/or detachments of the laminated material. Therefore, a cooler excellent in cooling/heat durability can be obtained.

According to Item [2], a brazing sheet can be obtained with less cost and can be more easily handled as compared with a plate-like brazing material. Therefore, by joining the lower surface of the Al layer of the laminated material and the cooling surface of the cooler main body by brazing using a brazing sheet as a brazing material, the laminated material and the cooler main body can be assuredly joined. Furthermore, a cooler can be produced at low cost and the production operations (brazing joining operations) can be performed easily.

According to Item [3], the laminated material and the cooler main body can be assuredly joined.

According to Item [4], the upper surface of the Ni layer can be cleaned by removing the Ni oxide film in the Ni oxide film removal step, thereby assuredly improving the soldering joinability.

According to Item [5], in the first diffusion joining step of the laminated material production step, by forming the Ni—Ti series superelastic alloy layer at the bonded interface of the Ni layer and the Ti layer, thermal stress (heat strain) can be further reduced by the superelastic alloy layer. Therefore, occurrences of breaking and/or detachments of the laminated material can be assuredly prevented.

According to Item [6], the laminated material production step exerts the following effects since it includes a second diffusion joining step of joining the Ti layer and the Al layer by diffusion joining after the first diffusion joining step.

That is, if the Ni layer and the Ti layer are joined after joining the Ti layer and the Al layer, there is a risk that an alloy layer poor in strength (e.g., Al—Ti alloy layer) can be formed at the bonded interface of the Ti layer and the Al layer by the heat for joining the Ni layer and the Ti layer. On the other hand, by joining the Ti layer and the Al layer after joining the Ni layer and the Ti layer, such an alloy layer poor in strength can be assuredly prevented from being formed at the bonded interface of the Ti layer and the Al layer.

Furthermore, if the Ti layer and the Al layer are joined by brazing instead of diffusion joining, a Ti—Al—Si alloy layer in which Ti of the Ti layer, Al of the Al layer, and Si in the brazing material are alloyed is formed at the bonded interface of the Ti layer and the Al layer. This alloy layer is poor in strength. This causes easy breaking and/or detachments at the alloy layer. To solve the problem, the Ti layer and the Al layer are joined, not by brazing, but by diffusion joining. Consequently, occurrences of breaking and/or detachments of the laminated material can be more assuredly prevented.

According to the production method of a semiconductor module as recited in Item [7], the insulating substrate and the cooler can be joined well by soldering.

According to the cooler as recited in Item [8], the cooler exerts the same effects as those of the aforementioned Items [1] to [6].

According to the semiconductor module as recited in Item [9], the semiconductor module in which the insulating substrate and the cooler are joined well by soldering. Therefore, a semiconductor module high in joining strength and high in cooling performance can be obtained.

According to the cooler as recited in Item [10], the cooler exerts the same effects as those of any one of the Items [1] to [6].

According to the semiconductor module as recited in Item [11], the semiconductor module in which the insulating substrate and the cooler are joined well by soldering. Therefore, a semiconductor module high in joining strength and high in cooling performance can be obtained.

PREFERRED EMBODIMENTS FOR CARRYING OUT THE INVENTION

Next, an embodiment of the present invention will be explained with reference to the attached drawings.

Figure 1:
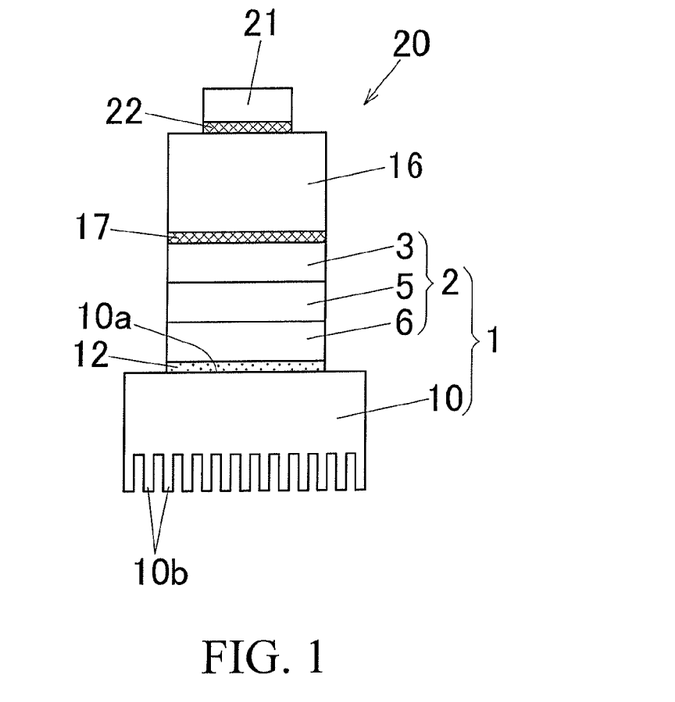
FIG. 1 is a schematic front view showing a semiconductor module equipped with a cooler according to an embodiment of the present invention.

In FIG. 1, the reference numeral "20" denotes a semiconductor module (including a power semiconductor module) according to one embodiment of the present invention. The semiconductor module 20 is equipped with a semiconductor element 21, an insulating substrate 16, and a cooler 1 according to an embodiment of the present invention.

The semiconductor module 20 is, e.g., an IGBT module, a MOSFET module, a Thyristor module, or a diode module.

The semiconductor element 21 is mounted on the insulating substrate 16. The semiconductor element 21 is, e.g., an IGBT chip, a MOSFET chip, a Thyristor chip, or a diode chip.

The insulating substrate 16 includes an electric insulation layer (not illustrated), a wiring layer (not illustrated), and a metal layer (not illustrated). The electric insulation layer is made of a ceramic, such as, e.g., AlN, $Al_2O_3$, $Si_3N_4$, $Y_2O_3$, CaO, BN, BeO, etc. Specifically, the electric insulation layer is made of a ceramic plate. The wiring layer is made of a metal, such as, e.g., Cu, Al, etc. Specifically, the wiring layer is made of a metal plate, such as, e.g., a Cu or Cu alloy plate, an Al or Al alloy plate, etc. The wiring layer is joined to the upper surface of the electric insulation layer in a laminated manner. The metal layer has a function to reduce thermal stress and is made of, e.g., Cu, Al, etc. Specifically, the metal layer is made of a metal plate, such as, e.g., a Cu or Cu alloy plate, an Al or Al alloy plate, etc. The metal layer is joined to the lower surface of the electric insulation layer in a laminated manner. The lower surface of the insulating substrate 16 is made of soldable metal such as Cu.

The semiconductor element 21 is joined to the upper surface of the insulating substrate 16 by soldering. Therefore, a soldering layer 22 joining the insulating substrate 16 and the semiconductor element 21 is interposed at the bonded interface of the insulating substrate 16 and the semiconductor element 21. In Figures, the soldering layer 22 is shown with cross-hatchings for an easy distinction from other layers. The other soldering layer 17, which will be explained later, is also shown with cross-hatchings for the same reason. For the insulating substrate 16, a DBC substrate etc. can be used.

Figure 2:
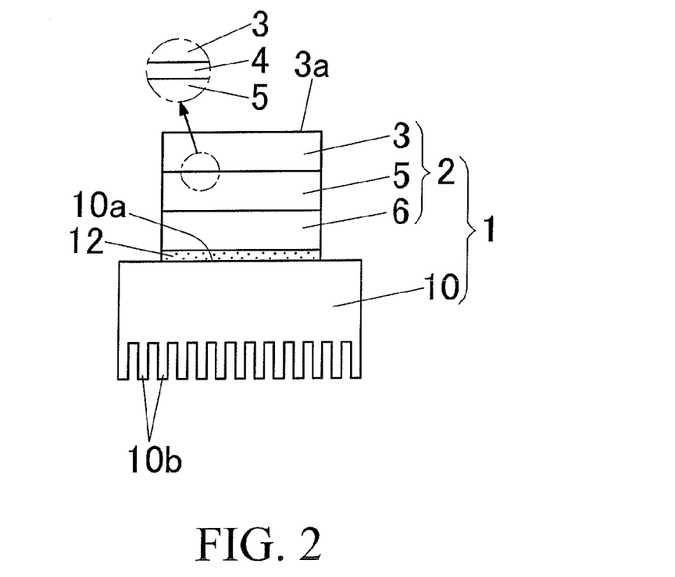
FIG. 2 is a schematic front view of the cooler.

As shown in FIG. 2, the cooler 1 is of a water-cooling type or an air-cooling type configured to lower the temperature of the semiconductor element 21 raised due to the operation of the semiconductor element 21. As shown in FIG. 1, the cooler 1 includes a cooler main body 10 and a laminated material 2. In this embodiment, as the cooler main body 10 of the cooler 1, an air-cooling type heat sink having a plurality of heat dissipation fins 10b is used. In this embodiment, the insulating substrate 16 to which the semiconductor element 21 is mounted corresponds to a member to be cooled, which is to be cooled by the cooler 1.

The cooler main body 10 is made of metal. Specifically, the cooler main body 10 is made of, for example, Al or an Al alloy. A cooling surface 10a formed on an opposite side of the heat dissipation fins 10b of the cooler main body 10 is approximately flat.

The laminated material 2 includes, from the top, a Ni layer 3, a Ti layer 5, and an Al layer 6 arranged in this order, and the layers 3, 5, and 6 are integrally joined in a laminated manner. Each layer is arranged horizontally and formed into an approximately rectangular shape in plan view.

The Ni layer 3 is made of Ni or a Ni alloy. Specifically, the Ni layer 3 is made of a Ni or Ni alloy plate. Furthermore, for the Ni layer 3, the lower surface of the insulating substrate 16 is to be joined to the upper surface 3a of the Ni layer 3 by soldering. That is, the Ni layer 3 has an upper surface to which the lower surface of the insulating substrate 16 as a member to be cooled is to be joined by soldering. In FIG. 1, the reference numeral "17" denotes a soldering layer joining the Ni layer 3 and the insulating substrate 16. This soldering layer 17 is interposed at the bonded interface of the Ni layer 3 and the insulating substrate 16. The thickness of the soldering layer 17 is, for example, 1 to 5 µm.

The Ti layer 5 is made of Ti or a Ti alloy. Specifically, the Ti layer 5 is made of a Ti or Ti alloy plate. The Ti layer 5 has a function to create a Ni—Ti series superelastic alloy layer 4 at the bonded interface of the Ni layer 3 and the Ti layer 5 by alloying Ni which is a constituent element of Ni layer 3 and Ti which is a constituent element of the Ti layer 5. The Ti layer 5 is arranged on the lower surface side of the Ni layer 3, and the Ni layer 3 and the Ti layer 5 are joined to each other by diffusion joining (e.g., clad rolling, Spark Plasma Sintering) in a laminated manner. That is, the Ti layer 5 is directly joined to the lower surface of the Ni layer 3.

Furthermore, with this joining, a Ni—Ti series superelastic alloy layer 4, in which Ni of the Ni layer 3 and Ti of the Ti layer 5 is alloyed, is thinly formed at the bonded interface of the Ni layer 3 and the Ti layer 5. Specifically, the Ni—Ti series superelastic alloy layer 4 is a layer including a Ni—Ti series superelastic alloy phase. In this embodiment, the Ni—Ti series superelastic alloy layer 4 is a layer that includes, e.g., a NiTi superelastic alloy phase, which is, in other words, is a NiTi superelastic alloy layer.

The superelastic alloy of the superelastic alloy layer 4 is preferred to have superelastic properties for the temperature range from room temperature to the operating temperature (example: 300° C.) of the semiconductor element 21. It is especially preferred that it has superelastic properties for the temperature range from room temperature to the brazing temperature (example: 600° C.) of the brazing joining step S4 which will be explained later.

The thicknesses of the Ni layer 3, the Ti layer 5 and the superelastic alloy layer 4 are not limited. However, the thermal conductivity of Ni is 90.7 W/m·K, the thermal conductivity of Ti is 21.9 W/m·K, and the thermal conductivity of Ni—Ti series superelastic alloy is 20.0 W/m·K, which are significantly lower than the thermal conductivity of Al, which is 236 W/m·K. Therefore, it is preferred that the Ni layer 3, the Ti layer 5, and the superelastic alloy layer 4 are as thin as possible to improve the thermal conductivity of the insulating substrate 16. For this reason, it is preferred that the upper limit of the thickness of the Ni layer 3 is 200 µm, the upper limit of the thickness of the Ti layer 5 is 200 µm, and the upper limit of the thickness of the superelastic alloy layer 4 is 50 µm.

On the other hand, if these layers 3, 4, and 5 are too thin, there is a risk that the desired properties of each layer are not exhibited. Therefore, it is preferred that the lower limit of the thickness of the Ni layer 3 is 5 µm, the lower limit of the thickness of the Ti layer 5 is 5 µm, and the lower limit of the thickness of the superelastic alloy layer 4 is 0.05 µm.

The Al layer 6 is made of Al or an Al alloy. Specifically, the Al layer 6 is made of an Al or Al alloy plate. The Al layer 6 is arranged on the lower surface side of the Ti layer 5. The Ti layer 5 and the Al layer 6 are joined to each other by diffusion joining (e.g., clad rolling, Spark Plasma Sintering) in a laminated manner. That is, the Al layer 6 is directly joined to the lower surface of the Ti layer 5. The thickness of the Al layer 6 is especially preferred to be set to a range of 30 to 100 µm so that the Al layer 6 can be joined well to the Ti layer 5 by diffusion joining. Furthermore, when a softened or melted brazing material 12 for joining the Al layer 6 and the cooler main body 10 by the brazing joining heat in the later explained brazing joining step S4 comes into contact with the Ti layer 5, a Ti—Al—Si alloy layer poor in strength will be formed at the contact portion. This causes an easy breaking and/or detachments at the alloy layer. To solve the problem, the thickness of the Al layer 6 is especially preferred to be thicker than the thickness of the brazing material 12.

As explained above, the Ni layer 3, the Ti layer 5, and the Al layer 6 are integrally joined in a laminated manner to constitute the laminated material 2.

The lower surface of the Al layer 6 of the laminated material 2 and the cooling surface 10a of the cooler main body 10 are joined by brazing. Therefore, at the bonded interface of the lower surface of the Al layer 6 of the laminated material 2 and the cooling surface 10a of the cooler main body 10, the brazing material 12 as a brazed layer joining the aforementioned surfaces is interposed in a laminated manner. In figures, the brazing material 12 is shown with dot-hatching for easier discrimination from other layers.

A plate-like brazing material or a brazing sheet is used as the brazing material 12. The thickness of the plate-like brazing material is, for example, 10 to 100 μm. The thickness of the brazing sheet is, for example, 100 to 300 μm. The brazing sheet includes an Al or Al alloy plate as a core material and brazing material cladded (joined) on both surfaces of the Al or Al alloy plate.

In the cooler 1, a Ni oxide film (11, see FIG. 3) formed on the upper surface 3a of the Ni layer 3 of the laminated material 2 is removed, whereby the upper surface 3a of the Ni layer 3 is cleaned and the soldering joinability is assuredly improved.

Next, a production method of the cooler 1 and that of the semiconductor module 20 of this embodiment will be explained with reference to FIGS. 3 to 5.

Figure 3:
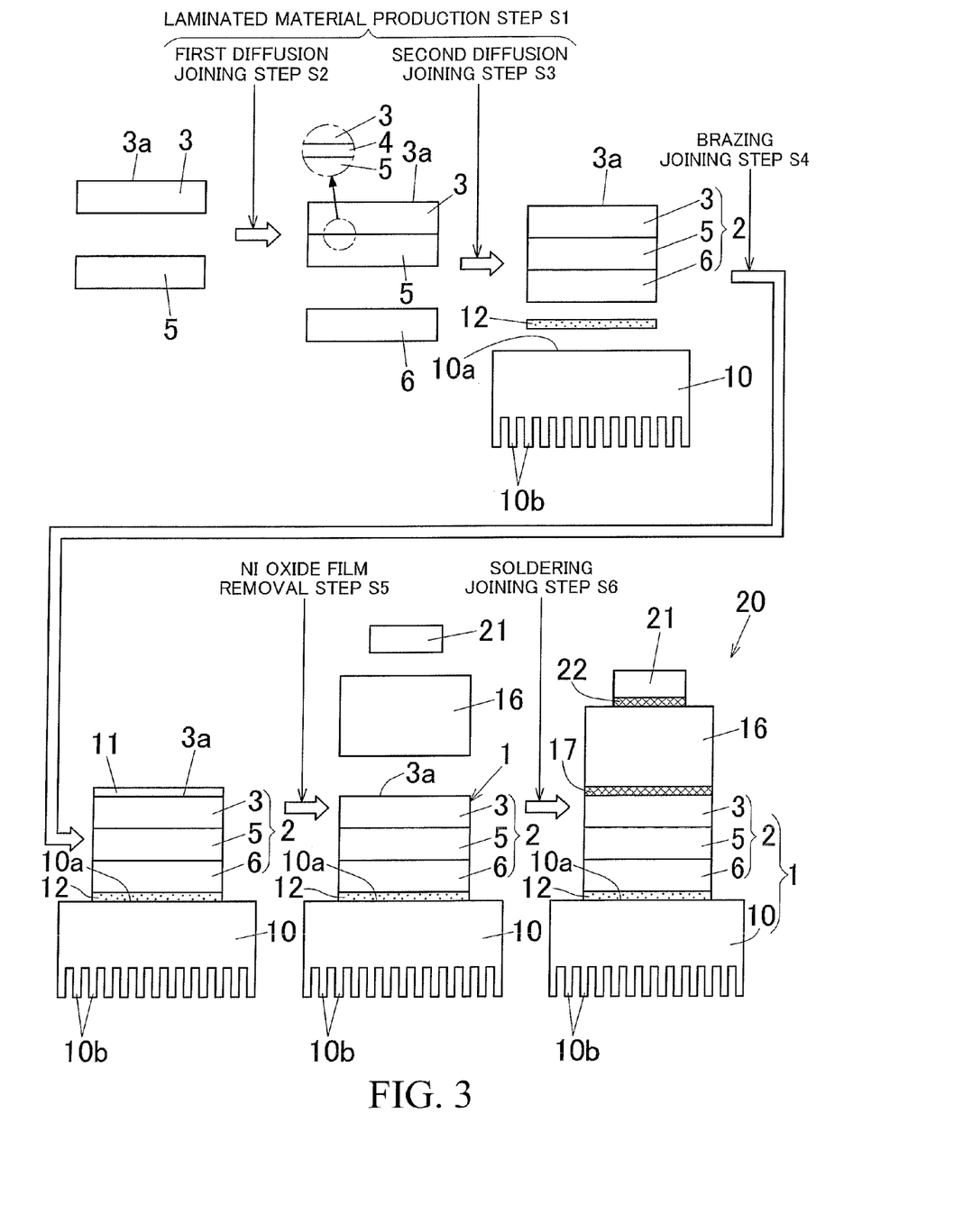
FIG. 3 is a schematic front view showing the production steps of the semiconductor module.

As shown in FIG. 3, the production method of the cooler 1 of this embodiment includes a laminated material production step S1, a brazing joining step S4, and a Ni oxide film removal step S5. The brazing joining step S4 is performed after the laminated material production step S1. The Ni oxide film removal step S5 is performed after the brazing joining step S4.

The laminated material production step S1 is a step of producing a laminated material 2 in which a Ni layer 3, a Ti layer 5, and an Al layer 6 are integrally joined in a laminated manner. Specifically, the laminated material production step S1 includes a first diffusion joining step S2 and a second diffusion joining step S3. The second diffusion joining step S3 is performed after the first diffusion joining step S2.

In the first diffusion joining step S2, the Ni layer 3 and the Ti layer 5 are stacked on each other and joined by diffusion joining in an laminated manner, thereby forming a Ni—Ti series superelastic alloy layer 4 at the bonded interface of the Ni layer 3 and the Ti layer 5. In other words, the Ni layer 3 and the Ti layer 5 are joined by diffusion joining so that the Ni—Ti series superelastic alloy layer 4 is formed at the bonded interface of the Ni layer 3 and the Ti layer 5. A method such as a clad rolling method, a Spark Plasma Sintering method, etc. is used as the diffusion joining method. The superelastic alloy layer 4 formed by the diffusion joining includes a Ni—Ti series superelastic alloy phase and has a slanted material structure in which the composition ratio of Ni and Ti gradually changes in the thickness direction. Therefore, the superelastic alloy layer 4 functions to assuredly decrease and absorb thermal stress.

In addition, even if the Ni layer 3 and the Ti layer 5 are joined by brazing instead of diffusion joining, such a superelastic alloy layer 4 will not be formed at the bonded interface of the layers 3 and 5.

The Spark Plasma Sintering (SPS) method is generally applied to sinter fine particles or to join members. In this embodiment, the method is applied to join members (specifically, metal plates). The Spark Plasma Sintering method is also called "SPS joining method" and "Pulsed Current Hot Pressing: PCHP".

When joining the Ni layer 3 and the Ti layer 5 by clad rolling for diffusion joining, it is preferred that the layers 3 and 5 are joined by warm or hot clad rolling to assuredly form the superelastic alloy layer 4 between the layers 3 and 5. That is, as shown in FIG. 4, using a clad rolling mill 30 equipped with a pair of upper and lower rolls 31 and 31 arranged parallel to one another, the Ni layer 3 and the Ti layer 5 stacked on one another are passed through between the rolls 31 and 31 to compress the Ni layer 3 and the Ti layer 5 by the rolls 31 and 31 to thereby join (clad) the Ni layer 3 and the Ti layer 5.

At the time of this joining, due to the heat during the joining of the Ni layer 3 and the Ti layer 5, Ni of the Ni layer 3 and Ti of the Ti layer 5 diffuse at the bonded interface of the layers 3 and 5, and the diffused Ni and Ti are alloyed to form the Ni—Ti series superelastic alloy layer 4 at the bonded interface of the layers 3 and 5. As a result, the Ni—Ti series superelastic alloy layer 4 is interposed at the bonded interface of layers 3 and 5. The joining condition is not specifically limited as long as the Ni layer 3 and the Ti layer 5 can be joined by clad rolling so that the Ni—Ti series superelastic alloy layer 4 is formed at the bonded interface of the layers 3 and 5. For example, the joining condition can be a cladding temperature of 630 to 750° C. and a cladding rate of 40 to 60%.

Figure 5:
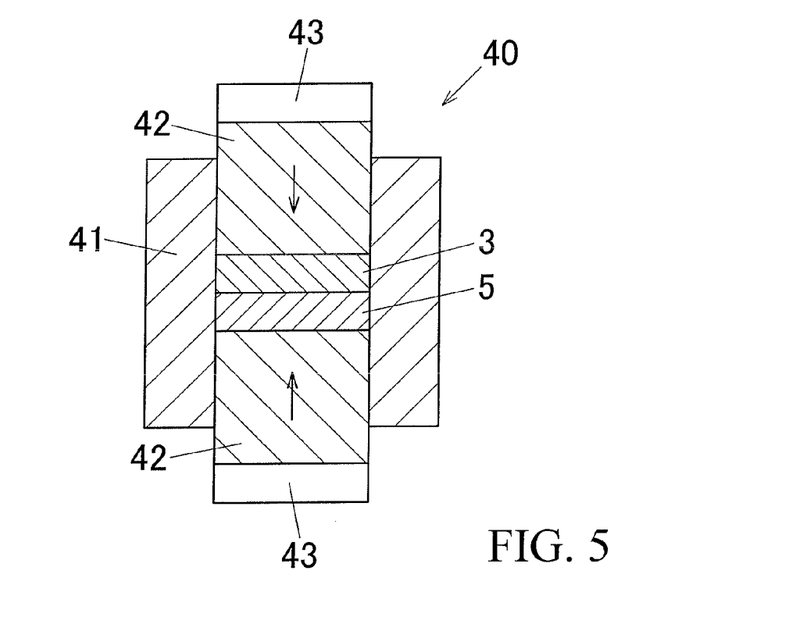
FIG. 5 is a schematic cross-sectional view showing a first diffusion joining step of joining the Ni layer and the Ti layer by a Spark Plasma Sintering method for diffusion joining.

When joining the Ni layer 3 and the Ti layer 5 by a Spark Plasma Sintering method for diffusion joining, as shown in FIG. 5, first, the Ni layer 3 and the Ti layer 5 are stacked on one another and arranged in a laminated manner in the cylindrical die 41 of the Spark Plasma Sintering device 40. The layer 3 and 5 are surrounded by the die 41. The die 41 has electrical conductivity, and is made of, e.g., graphite. Next, the layers 3 and 5 are pinched by a pair of upper and lower punches 42 and 42 in the laminated direction. Each punch 42 has electrical conductivity and is made of, e.g., graphite. Electrodes 43 are each electrically connected to the base portion of each punch 42. For example, in a vacuum atmosphere of 1 to 10 Pa or in an inert gas atmosphere of, e.g., nitrogen or argon, with the layers 3 and 5 being pressurized by the punches 42 and 42 in the laminated direction, the layers 3 and 5 are heated by passing pulsed currents between the punches 42 and 42 in a state in which conduction between the punches 42 and 42 are secured to thereby join the Ni layer 3 and the Ti layer 5.

In this manner, the Ni—Ti series superelastic alloy layer 4 is formed at the bonded interface of the Ni layer 3 and the Ti layer 5. In this joining, it is preferred that the joining conditions (example: heating temperature, retention time of the heating temperature, rate of temperature increase, and joining pressure) are set so that the Ni—Ti series superelastic alloy layer 4 having a predetermined thickness is formed. Specific examples of the joining conditions are as follows. The heating temperature is 600 to 700° C., the retention time of the heating temperature is 5 to 20 minutes, the rate of temperature increase from room temperature to the heating temperature is 5 to 50° C./min, and the joining pressure to the layers 3 and 5 is 10 to 20 MPa.

In the second diffusion joining step S3, the Ti layer 5 and the Al layer 6 are stacked on one another and joined with each other by diffusion joining after the first diffusion joining step S2 in a laminated manner. As the diffusion joining, the aforementioned clad rolling method, the aforementioned Spark Plasma Sintering method, etc. can be used.

Figure 4:
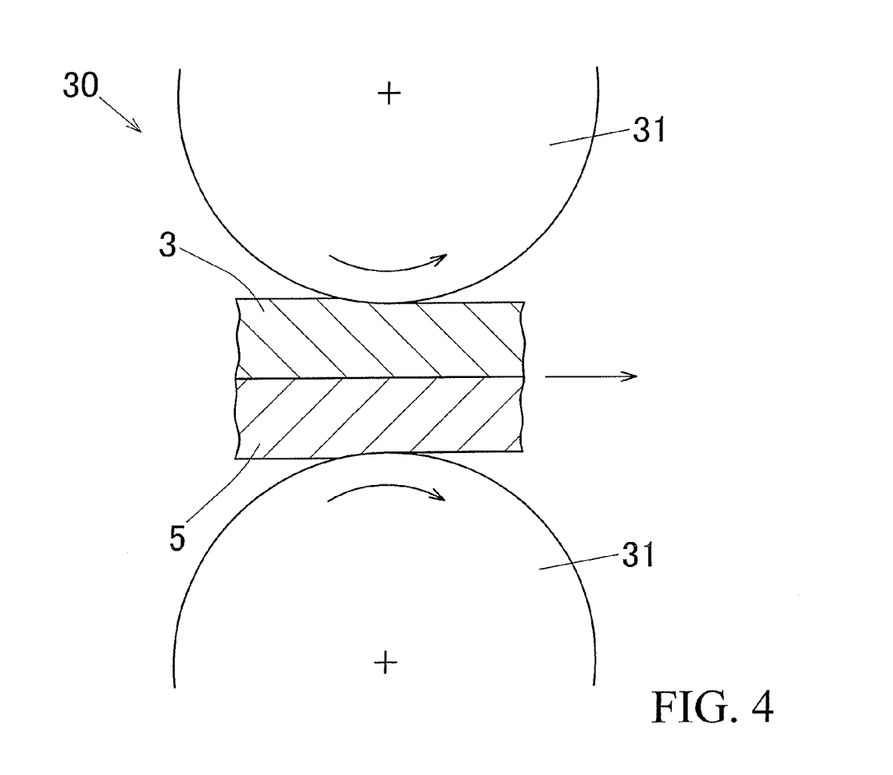
FIG. 4 is a schematic cross-sectional view showing a first diffusion joining step of joining the Ni layer and the Ti layer by clad rolling for diffusion joining.

When joining the Ti layer 5 and the Al layer 6 by clad rolling for diffusion joining, using the clad rolling mill 30 shown in FIG. 4, the joining is performed by cold or warm clad rolling in which a cladding temperature lower than the cladding temperature applied to the joining of the Ni layer 3 and the Ti layer 5 is set. The joining conditions are not specifically limited as long as the Ti layer 5 and the Al layer 6 can be joined by clad rolling. For example, the joining conditions are a cladding temperature of 350 to 430° C. and a cladding rate of 30 to 60%.

When joining the Ti layer 5 and the Al layer 6 by a Spark Plasma Sintering method for diffusion joining, the joining is performed using the Spark Plasma Sintering device shown in FIG. 5. The joining conditions can be any conditions as long as both the layers 5 and 6 can be joined. Specific examples of the joining conditions are as follows. The heating temperature is 500 to 560° C., the retention time of the heating temperature is 5 to 20 minutes, the rate of temperature increase from room temperature to the heating temperature is 5 to 50° C./min, and the joining pressure to the layer 5 and 6 is 10 to 20 MPa.

By sequentially performing the first diffusion joining step S2 and the second diffusion joining step S3 in the aforementioned manner, the laminated material 2 in which the Ni1 layer 3, the Ti layer 5, and the Al layer 6 are integrally secured in a laminated manner can be obtained.

Next, as shown in FIG. 3, the brazing joining step S4 is performed. The brazing joining step S4 is a step of joining the lower surface of the Al layer 6 of the laminated material 2 and the cooling surface 10a of the cooler main body 10.

In the brazing joining step S4, in a state in which a plate-like brazing material or a brazing sheet as a brazing material 12 is interposed between the lower surface of the Al layer 6 of the laminated material 2 and the cooling surface 10a of the cooler main body 10, the laminated material 2 is arranged on the cooling surface 10a of the cooler main body 10. Then, the lower surface of the Al layer 6 of the laminated material 2 and the cooling surface 10a of the cooler main body 10 are joined by brazing such as furnace brazing in vacuum. In this manner, the laminated material 2 and the cooler main body 10 are integrally joined. It is especially preferred that the brazing temperature is 580 to 610° C., the retention time of the brazing temperature is 5 to 30 minutes, and the degree of vacuum is $1 \times 10^{-3}$ to $1 \times 10^{-5}$ Pa. By performing the brazing joining under the aforementioned joining conditions, the laminated material 2 and the cooler main body 10 can be assuredly joined well.

In the brazing joining step S4, a thin Ni oxide film 11 is formed on the upper surface 3a of the Ni layer 3 by reacting the upper surface 3a of the Ni layer 3 of the laminated material 2 with oxygen contained in the brazing atmosphere (e.g., the remaining oxygen in the brazing atmosphere) by the brazing joining heat. The thickness of the Ni oxide film 11 is, for example, 0.001 to 0.1 µm.

Next, the Ni oxide film removal step S5 is performed. The Ni oxide film removal step S5 is a step of removing the Ni oxide film 11 formed on the upper surface 3a of the Ni layer 3 of the laminated material 2 mainly during the brazing joining step S4.

In the Ni oxide film removal step S5, the Ni oxide film 11 is removed by subjecting the upper surface 3a of the Ni layer 3 to, e.g., polishing (example: buffing) or abrasive blasting. Thereafter, the upper surface 3a of the Ni layer 3 is sequentially subjected to washing (example: water washing, hydrocarbon-based washing) and drying. In this manner, the upper surface 3a of the Ni layer 3 is cleaned.

Through the aforementioned steps, the cooler 1 of this embodiment can be obtained.

When producing a semiconductor module 20 using the cooler 1, the insulating substrate 16 (specifically, the lower surface of the insulating substrate 16) is joined to the upper surface 3a of the Ni layer 3 of the laminated material 2 of the cooler 1 by soldering. Thereafter, the semiconductor element 21 is joined to the upper surface of the insulating substrate 16 by soldering. Alternatively, after the semiconductor element 21 is joined to the upper surface of the insulating substrate 16 by soldering, the insulating substrate 16 can be joined to the upper surface 3a of the Ni layer 3 of the laminated material 2 of the cooler 1 by soldering. Alternatively, the joining of the insulating substrate 16 to the upper surface 3a of the Ni layer 3 by soldering can be performed simultaneously with the joining of the semiconductor element 21 to the upper surface of the insulating substrate 16 by soldering. Such a joining step by soldering is referred to as "a soldering joining step". The semiconductor module 20 is obtained in this manner.

The production method of the cooler 1 of this embodiment has the following advantages.

According to the production method of the cooler 1 of this embodiment, by joining the lower surface of the Al layer 6 of the laminated material 2 and the cooling surface 10a of the cooler main body 10 in the brazing joining step S4, the Ni layer 3 of the laminated material 2 is arranged on the upper surface side of the cooler 1 (that is, the surface side to which the insulating substrate 16 of the cooler 1 is to be joined). Thus, the upper surface 3a of the Ni layer 3 becomes the surface to which the insulating substrate 16 of the cooler 1 is to be joined, which in turn enables to obtain a cooler 1 having good soldering joinability. Therefore, the insulating substrate 16 can be joined well to the upper surface 3a of the Ni layer 3 of the cooler 1 by soldering.

Furthermore, in the laminated material production step S1, the Ti layer 5 is arranged between the Ni layer 3 and the Al layer 6, exerting the following effects. In other words, if the Ni layer 3 and the Al layer 6 are directly joined without arranging a Ti layer 5 between the Ni layer 3 and the Al layer 6, an alloy layer poor in strength will be formed at the bonded interface of the Ni layer 3 and the Al layer 6. As a result, breaking and/or detachments at the alloy layer are likely to occur due to thermal stress (heat strain) caused by cooling/heating cycles. On the other hand, in the production method of the cooler 1 of this embodiment, since the Ti layer 5 is arranged between the Ni layer 3 and the Al layer 6, such an alloy layer poor in strength will not be formed. In this way, occurrences of breaking and/or detachments of the laminated material 2 can be prevented. Therefore, the cooler 1 having excellent cooling/heating resistance can be obtained.

Furthermore, since a brazing sheet can be obtained at a lower cost and can be easily handled as compared with a plate-like brazing material, by performing the joining of the lower surface of the Al layer 6 of the laminated material 2 and the cooling surface 10a of the cooler main body 10 by brazing using a brazing sheet as the brazing material 12, the laminated material 2 and the cooler main body 10 can be assuredly joined. Furthermore, the cooler 1 can be produced at a lower cost and the production operations (that is, brazing joining operations) can be performed easily.

On the other hand, by performing the joining of the lower surface of the Al layer 6 of the laminated material 2 and the cooling surface 10a of the cooler main body 10 by brazing using a plate-like brazing material as the brazing material 12, the laminated material 2 and the cooler main body 10 can be assuredly joined.

Also, by removing the Ni oxide film 11 in the Ni oxide film removal step S5, the upper surface 3a of the Ni layer 3 can be cleaned, thereby assuredly improving the soldering joinability.

Furthermore, since the laminated material production step S1 includes the first diffusion joining step S2, the Ni—Ti series superelastic alloy layer 4 that can decrease thermal stress can be formed at the bonded interface of the Ni layer 3 and the Ti layer 5. Therefore, occurrences of breaking and/or detachments of the laminated material 2 can further assuredly be prevented.

Furthermore, the laminated material production step S1 includes the second diffusion joining step S3 joining the Ti layer 5 and the Al layer 6 after the first diffusion joining step S2, exerting the following effects.

That is, if the Ni layer 3 and the Ti layer 5 are joined after joining the Ti layer 5 and the Al layer 6, there is a risk that an alloy layer poor in strength (example: Al—Ti alloy layer) can be formed at the bonded interface of the Ti layer 5 and the Al layer 6 due to the heat at the time of joining the Ni layer 3 and the Ti layer 5. On the other hand, by joining the Ti layer 5 and the Al layer 6 after joining the Ni layer 3 and the Ti layer 5, such an alloy layer poor in strength can be assuredly prevented from forming between the Ti layer 5 and the Al layer 6.

Furthermore, if joining the Ti layer 5 and the Al layer 6 by brazing instead of diffusion joining, there is a risk that a Ti—Al—Si alloy layer in which Ti of the Ti layer 5, Al of Al layer 6, and Si in the brazing material 12 are alloyed is formed at the bonded interface of the Ti layer 5 and the Al layer 6. This alloy layer is poor in strength. Therefore, breaking and/or detachments at this alloy layer is more likely to occur. To solve this problem, the Ti layer 5 and the Al layer 6 are joined by diffusion joining. In this way, occurrences of breaking and/or detachments of the laminated material 2 can further be assuredly prevented.

While illustrative embodiments of the present invention have been described herein, the present invention is not limited to the embodiments described herein, but includes various changes that fall within the scope that does not deviate from the spirits of the invention.

Also, in the aforementioned embodiment, the cooler main body 10 is a heat sink, but in the present invention, the cooler main body 10 is not limited to a heat sink. Furthermore, in the present invention, the cooling mechanism of the cooler main body 10 is not limited, and can be of, e.g., an air-cooling type or a water-cooling type.

In the present specification, as described above, for the convenience of explanation, the surface side to which the member to be cooled (insulating substrate 16) of the cooler 1 is defined as the upper surface side of the cooler 1, but in the present invention, the vertical and horizontal directions of the cooler 1 can be set arbitrarily.

EXAMPLES

Next, specific Examples of the present invention will be explained. It should be noted, however, that the present invention is not specifically limited to these Examples.

Example 1

In this embodiment, a cooler 1 having the structure as shown in FIG. 1 was produced in accordance with the production method of the cooler of the aforementioned embodiment. The specific production method was as follows.

To produce the laminated material 2, the following plates having rectangular shape in plan view were prepared for the Ni layer 3, Ti layer 5, and the Al layer 6.

Ni layer 3: pure Ni plate having a length of 25 mm×a width of 25 mm×a thickness of 30 μm Ti layer 5: pure Ti plate having a length of 25 mm×a width of 25 mm×a thickness of 20 μm Al layer 6: Al alloy plate having a length of 25 mm×a width of 25 mm×a thickness of 80 μm The purity of the pure Ni plate forming the Ni layer 3 was JIS (Japanese Industrial Standards) Type 1. The purity of the pure Ti plate forming the Ti layer 5 was JIS Type 1. The material of the Al alloy plate forming the Al layer 6 was an aluminum alloy A1100 stipulated by JIS.

In the first diffusion joining step S2 of the laminated material production step S1, the Ni layer 3 and the Ti layer 5 were joined by warm and hot clad rolling to thereby form a NiTi superelastic alloy layer (thickness: around 1 μm) as the Ni—Ti series superelastic alloy layer 4 at the bonded interface of the Ni layer 3 and the Ti layer 5. Next, in the second diffusion joining step S3 of the laminated material production step S1, the Ti layer 5 and the Al layer 6 were joined by cold and warm clad rolling. In this way, the laminated material 2 in which the Ni layer 3, Ti layer 5, and Al layer 6 were integrally joined in a laminated manner was obtained.

Also, the following plate having a rectangular shape in plan view was prepared as the cooler main body 10.

Cooler main body 10: Al alloy plate having a length of 50 mm×a width of 50 mm×a thickness of 5 mm The material of the Al alloy plate forming the cooler main body 10 was an aluminum alloy A3003 stipulated by JIS. In addition, the Al alloy plate was prepared as a simulant of the cooler main body 10, and one surface side of the Al alloy plate was considered as the cooling surface 10a of the cooler main body 10.

Next, the brazing joining step S4 was performed in the following manner. In a state in which a plate-like Al series brazing material (brazing layer) as a brazing material 12 was interposed between the lower surface of the Al layer 6 of the laminated material 2 and the cooling surface 10a of the cooler main body 10 (a surface on one side of the Al alloy plate), the laminated material 2 was arranged on the cooling surface 10a of the cooler main body 10. The size of the plate-like brazing material was a length of 25 mm×a width of 25 mm×a thickness of 20 μm, and the material was Al-10 mass % Si.

Also, the laminated material 2 was pressed in the direction in which the lower surface of the Al layer 6 of the laminated material 2 and the cooling surface 10a of the cooler main body 10 were adhered, and the lower surface of the Al layer 6 of the laminated material 2 and the cooling surface 10a of the cooler main body 10 were joined by furnace brazing in a vacuum while maintaining that condition. The brazing joining condition at the time was: the pressure: 490 Pa (5 gf/cm$^2$); the brazing temperature: 600° C.; the retention time of the brazing temperature: 20 minutes; and the degree of vacuum: $4\times10^{-4}$ Pa. Then, when the brazing joining was done, the pressure to the laminated material 2 was released.

Next, the Ni oxide film removal step S5 was performed in the following manner. That is, to remove the Ni oxide film 11 formed on the upper surface 3a of the Ni layer 3 of the laminated material 2, the upper surface 3a of the Ni layer 3 was buffed until metallic gloss was present on the upper surface 3a. Afterward, the upper surface 3a of the Ni layer 3 was sequentially washed by water washing and a hydrocarbon-based washing. In this manner, the upper surface 3a of the Ni layer 3 was cleaned.

For the cooler 1 obtained by the aforementioned steps, the upper surface 3a of the Ni layer 3 of the laminated material 2 thereof was attempted to be joined to the lower surface of the insulating substrate 16 by soldering using a reflow furnace. As a result, an insulating substrate 16 was joined well to the upper surface 3a of the Ni layer 3.

Comparative Example 1

The following plate having a rectangular shape in plan view was prepared as the cooler main body 10.

Cooler main body 10: Al alloy plate having a length of 50 mm×a width of 50 mm×a thickness of 5 mm The material of the Al alloy plate forming the cooler main body 10 was an aluminum alloy A3003 stipulated by JIS. In addition, the Al alloy plate was prepared as a simulant of the cooler main body 10, and one surface side of the Al alloy plate was considered as the cooling surface 10a of the cooler main body 10.

Next, the cooler main body 10 was heat treated under the same condition as the brazing joining condition (brazing temperature, retention time of the brazing temperature, degree of vacuum) used in the brazing joining step S4 of the aforementioned embodiment. Next, the cooling surface 10a of the cooler main body 10 was buffed under the same condition as the removal condition used in the Ni oxide film removal step S5 of the aforementioned embodiment. Afterwards, the cooling surface 10a was sequentially washed with water and hydrocarbon.

Next, the lower surface of the insulating substrate 16 was attempted to be joined to the cooling surface 10a of the cooler main body 10 by soldering using a reflow furnace. As a result, it was found that the insulating substrate 16 could not be joined to the cooling surface 10a.

The terms and descriptions used herein are used only for explanatory purposes and the present invention is not limited to them. The present invention allows various design-changes falling within the claimed scope of the present invention unless it deviates from the spirits of the invention.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

INDUSTRIAL APPLICABILITY

The present invention can be used as a production method for a cooler to be used for cooling a member to be cooled such as insulating substrate, a production method for a semiconductor module, a cooler, and a semiconductor module.

DESCRIPTION OF THE REFERENCE NUMERALS

1: cooler
2: laminated material
3: Ni layer
4: Ni—Ti series superelastic alloy layer
5: Ti layer
6: Al layer
10: cooler main body
11: Ni oxide film
12: brazing material (brazing layer)
16: insulating substrate (member to be cooled)
17: soldering layer
20: semiconductor module
21: semiconductor element
22: soldering layer
30: clad rolling mill
40: Spark Plasma Sintering device

The invention claimed is:

1. A production method of a cooler, comprising:
a laminated material production step of producing a laminated material formed by integrally joining a Ni layer made of Ni or a Ni alloy having an upper surface to which a member to be cooled is to be joined by soldering, a Ti layer made of Ti or a Ti alloy and arranged on a lower surface side of the Ni layer, and an Al layer made of Al or an Al alloy and arranged on a lower surface side of the Ti layer in a laminated manner; and
a brazing joining step of joining a lower surface of the Al layer of the laminated material and a cooling surface of a cooler main body by brazing.

2. The production method of a cooler as recited in claim 1, wherein, in the brazing joining step, the joining is performed by brazing using a brazing sheet as a brazing material.

3. The production method of a cooler as recited in claim 1, wherein, in the brazing joining step, the joining is performed by brazing using a plate-shaped brazing material as a brazing material.

4. The production method of a cooler as recited in claim 1, further comprising a Ni oxide film removal step of removing a Ni oxide film formed on the upper surface of the Ni layer of the laminated material after the brazing joining step.

5. The production method of a cooler as recited in claim 1, wherein the laminated material production step includes a first diffusion joining step of joining the Ni layer and the Ti layer by diffusion joining to thereby form a Ni—Ti series superelastic alloy layer in which Ni in the Ni layer and Ti in the Ti layer are alloyed at a bonded interface of the Ni layer and the Ti layer.

6. The production method of a cooler as recited in claim 5, wherein the laminated material production step includes a second diffusion joining step of joining the Ti layer and the Al layer by diffusion joining after the first diffusion joining step.

7. A production method of a semiconductor module, comprising the step of:

joining an insulating substrate as a member to be cooled to which a semiconductor element is to be mounted to the upper surface of the Ni layer of the laminated material of the cooler obtained by the production method of claim 1 by soldering.

8. A cooler comprising:

a laminated material formed by integrally joining a Ni layer made of Ni or a Ni alloy having an upper surface to which a member to be cooled is to be joined by soldering, a Ti layer made of Ti or a Ti alloy and arranged on a lower surface side of the Ni layer, and an Al layer made of Al or an Al alloy and arranged on a lower surface side of the Ti layer in a laminated manner, wherein a lower surface of the Al layer of the laminated material and a cooling surface of a cooler main body are joined via a brazing material layer.

9. The cooler as recited in claim 8, wherein a Ni—Ti series superelastic alloy layer in which Ni in the Ni layer and Ti in the Ti layer are alloyed is formed at a bonded interface of the Ni layer and the Ti layer.

10. A semiconductor module, wherein an insulating substrate as a member to be cooled to which a semiconductor element is to be mounted is joined to the upper surface of the Ni layer of the laminated material of claim 8 via a soldering layer.

* * * * *